(12) United States Patent
Song et al.

(10) Patent No.: US 8,872,531 B2
(45) Date of Patent: Oct. 28, 2014

(54) SEMICONDUCTOR DEVICE AND TEST APPARATUS INCLUDING THE SAME

(75) Inventors: Ki-jae Song, Paju-si (KR); Ung-jin Jang, Pohang-si (KR); Jun-young Park, Pohang-si (KR); Sung-gu Lee, Pohang-si (KR); Hong-seok Yeon, Cheonan-si (KR)

(73) Assignees: Samsung Electronics Co., Ltd., Suwon-si, Gyeonggi-do (KR); Postech Academy Industry Foundation, Pohang-si, Gyeongsangbuk-do (KR)

( * ) Notice: Subject to any disclaimer, the term of this patent is extended or adjusted under 35 U.S.C. 154(b) by 442 days.

(21) Appl. No.: 13/049,349

(22) Filed: Mar. 16, 2011

(65) Prior Publication Data

US 2011/0227593 A1  Sep. 22, 2011

(30) Foreign Application Priority Data

Mar. 16, 2010  (KR) .................. 10-2010-0023407

(51) Int. Cl.
*G01R 31/36* (2006.01)
*G11C 29/56* (2006.01)
*G01R 31/319* (2006.01)

(52) U.S. Cl.
CPC .... *G01R 31/31922* (2013.01); *G11C 29/56012* (2013.01); *G11C 29/56* (2013.01)
USPC .............. 324/750.15; 324/750.08; 324/750.3; 324/754; 324/762.02; 714/25; 714/30; 714/31; 714/724; 714/733; 714/734

(58) Field of Classification Search
CPC .................. H01L 2223/54413; H01L 22/34; G11C 2029/3602
USPC ................. 324/750.15, 750.08, 750.3, 754, 324/762.02; 714/25, 30, 31, 724, 733, 734
See application file for complete search history.

(56) References Cited

U.S. PATENT DOCUMENTS

| | | | |
|---|---|---|---|
| 6,028,439 A * | 2/2000 | Arkin et al. | 324/762.02 |
| 6,202,186 B1 * | 3/2001 | Oonk | 714/738 |
| 6,483,338 B2 | 11/2002 | Weng et al. | |
| 6,715,000 B2 * | 3/2004 | Cheung et al. | 710/28 |
| 6,744,272 B2 | 6/2004 | Ernst et al. | |
| 7,290,186 B1 | 10/2007 | Zorian et al. | |
| 7,385,385 B2 * | 6/2008 | Magliocco et al. | 324/750.08 |
| 7,486,718 B2 * | 2/2009 | Sutardja et al. | 375/215 |
| 7,816,910 B2 * | 10/2010 | Shim et al. | 324/750.3 |
| 2002/0048211 A1 * | 4/2002 | Tsujino et al. | 365/233 |
| 2002/0097616 A1 * | 7/2002 | Schneider et al. | 365/200 |
| 2004/0046586 A1 * | 3/2004 | Ichikawa | 324/765 |
| 2005/0149788 A1 * | 7/2005 | Jeon et al. | 714/724 |
| 2008/0189585 A1 | 8/2008 | Sato | |
| 2009/0160467 A1 * | 6/2009 | Fukushima et al. | 324/754 |
| 2010/0164527 A1 * | 7/2010 | Weyh et al. | 324/763 |

\* cited by examiner

*Primary Examiner* — Jermele M Hollington
*Assistant Examiner* — Giovanni Astacio-Oquendo
(74) *Attorney, Agent, or Firm* — Lee & Morse, P.C.

(57) ABSTRACT

A semiconductor device and a test apparatus including the same, the semiconductor device including a command distributor receiving a serial command that is synchronized with a first clock signal and converting the serial command into a parallel command, a command decoder receiving the parallel command and generating a pattern sequence based on the parallel command, and a signal generator receiving the pattern sequence and generating operating signals synchronized with a second clock signal, wherein a frequency of the first clock signal is less than a frequency of the second clock signal.

17 Claims, 8 Drawing Sheets

FIG. 5A

| Serial / Parallel command | | | | | |
|---|---|---|---|---|---|
| 0000 0000 | 0 | 0 | 00 | 00 | 00 |
| PARAMETER SIGNAL | Data to write | Data to compare | Operation | Target | Increment pattern |

REQUEST SIGNAL

FIG. 5B

| Data to write / compare | |
|---|---|
| 0 | 00h |
| 1 | FFh |

FIG. 5C

| Operation | |
|---|---|
| 00 | Move |
| 01 | Read |
| 10 | Write |
| 11 | Write after Read |

FIG. 5D

| Target | |
|---|---|
| 00 | Column |
| 01 | Row |
| 10 | Bank |
| 11 | N/A |

FIG. 5E

| Increment pattern | |
|---|---|
| 00 | Increase from LSB |
| 01 | Increase from MSB |
| 10 | Decrease from LSB |
| 11 | Decrease from MSB |

FIG. 8

| CLK2 | Parallel command | Pattern sequence |
|---|---|---|
| 1 | 0000 0000 00 00 00 00 | set column address as 00000000h |
| 2 | 0000 0000 00 00 01 00 | set row address as 00000000h |
| 3 | 0000 0000 00 00 10 00 | set bank address as 00h |
| 4 | 0011 1111 01 01 00 00 | 00 00000000 00000000 → read and compare with FFh |
| 5 | | 00 00000000 00000001 → read and compare with FFh |
| 6 | | 00 00000000 00000010 → read and compare with FFh |
| 7 | | 00 00000000 00000011 → read and compare with FFh |
| ... | | ... |
| 130 | | 00 00000000 00111111 → read and compare with FFh |

SEMICONDUCTOR DEVICE AND TEST APPARATUS INCLUDING THE SAME

BACKGROUND

1. Field

Embodiments relate to a semiconductor device and a test apparatus including the same, and more particularly, to a semiconductor device including a driving circuit used for a test and a test apparatus including the semiconductor device.

2. Description of the Related Art

When a memory device is manufactured, a memory component manufactured by performing a predetermined assembling process finally undergoes a test process of checking whether the memory component performs a predetermined function. A test apparatus performs the test process by applying an operating signal to the memory component to be tested.

SUMMARY

One or more embodiments may provide a semiconductor device capable of reducing power consumption due to generation of high frequency signals and a test apparatus including the same.

One or more embodiments may provide a test apparatus that reduces manufacturing costs and may be flexibly designed.

One or more embodiments may provide a semiconductor device including a command distributor receiving a serial command that is synchronized with a first clock signal and converting the serial command into a parallel command, a command decoder receiving the parallel command and generating a pattern sequence based on the parallel command, and a signal generator receiving the pattern sequence and generating operating signals synchronized with a second clock signal, wherein a frequency of the first clock signal is less than a frequency of the second clock signal.

The command distributor may convert the serial command into the parallel command synchronized with the second clock signal.

The semiconductor device may further include a test pattern storage unit storing at least one pattern information, wherein the command decoder generates the pattern sequence by combining the parallel command with the pattern information.

The parallel command may include a request signal and a parameter signal, and the test pattern storage unit may receive the request signal and transmits the pattern information corresponding to the request signal to the command decoder, and the command decoder may include a synthesis unit generating the pattern sequence by increasing or decreasing the parameter signal according to the pattern information.

The signal generator may generate the operating signals by combining the pattern sequence with format information, level information, and timing information about a device under test (DUT).

The operating signals may include a control signal, an address signal, and an input data signal.

The command distributor may further include a serial/parallel converter and a first buffer, and the serial/parallel converter may convert the serial command into the parallel command, and the first buffer may store a new parallel command while the command decoder generates the pattern sequence.

The semiconductor device may further include a comparator receiving an output data signal from a DUT and generating a defective result signal by comparing the output data signal with the input data signal.

The semiconductor device may further include a result transmitter transmitting a serial test result in which the defective result signal is synchronized with the first clock signal.

The result transmitter may include a parallel/serial converter converting the defective result signal into a serial signal.

The result transmitter may include a second buffer, and the second buffer may store a new defective result signal while the result transmitter transmits the serial test result.

One or more embodiments may provide a test apparatus including: at least one semiconductor device, wherein the at least one semiconductor device including a command distributor receiving a serial command that is synchronized with a first clock signal and converting the serial command into a parallel command, a command decoder receiving the parallel command and generating a pattern sequence based on the parallel command, and a signal generator receiving the pattern sequence and generating operating signals synchronized with a second clock signal, wherein a frequency of the first clock signal is less than a frequency of the second clock signal.

The test apparatus may further include a substrate on which the semiconductor device is mounted, and at least one socket mounted on the substrate and providing space in which a device under test (DUT) is to be mounted.

The test apparatus may further include a test signal channel connecting the semiconductor device and the socket, wherein the test signal channel transmits the operating signals from the signal generator to the DUT connected to the socket.

The semiconductor device may include a plurality of semiconductor devices, and the socket may include a plurality of sockets, and the test signal channel may include a plurality of test signal channels, and the plurality of semiconductor devices and the plurality of sockets may be connected at a ratio of 1:1 via the plurality of test signal channels.

The substrate may include a Hi-Fix board.

One or more embodiments may provide a test apparatus including a substrate receiving a serial command that is synchronized with a first clock signal; at least one socket mounted on the substrate and providing space in which a device under test (DUT) is to be mounted, and at least one semiconductor device mounted on the substrate and connected between the substrate and the at least one socket, wherein the at least one semiconductor device includes a signal generator generating operating signals synchronized with a second clock signal that is different from the first clock signal from the serial command and applying the operating signals to the DUT.

A frequency of the first clock signal may be less than a frequency of the second clock signal.

The test apparatus may further include a test signal channel connecting the semiconductor device and the socket, wherein the test signal channel transmits the operating signals from the signal generator to the DUT connected to the socket.

The semiconductor device may include a plurality of semiconductor devices, and the socket may include a plurality of sockets, and the test signal channel may include a plurality of test signal channels, and the plurality of semiconductor devices and the plurality of sockets may be connected at a ratio of 1:1 via the plurality of test signal channels.

BRIEF DESCRIPTION OF THE DRAWINGS

Features will become more apparent to those of ordinary skill in the art by describing in detail exemplary embodiments with reference to the attached drawings, in which:

FIGS. 5A, 5B, 5C, 5D, and 5E illustrate tables for explaining exemplary serial/parallel commands of a semiconductor device;

FIG. 8 illustrates a timing table for explaining exemplary operations of the semiconductor device of FIG. 1 or 2 and the test apparatus of FIG. 3.

DETAILED DESCRIPTION

Figure 1:
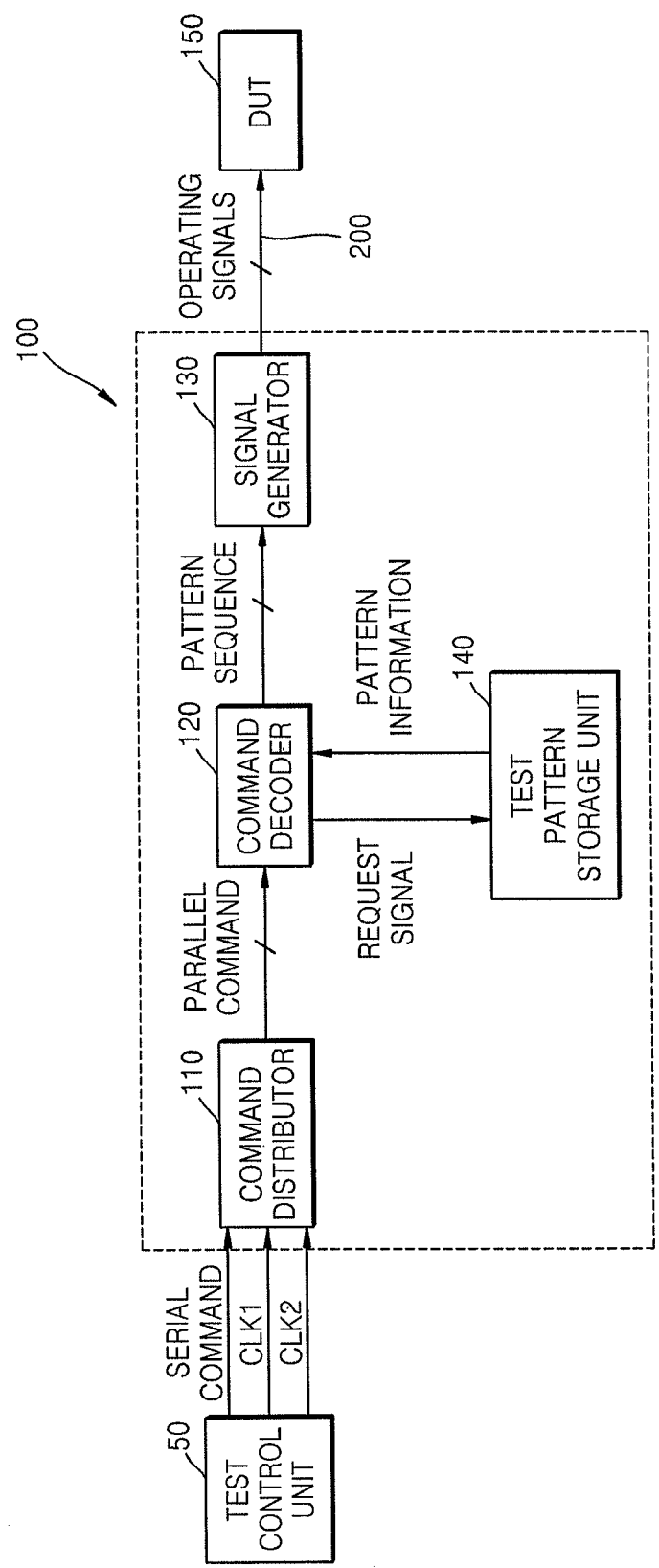
FIG. 1 illustrates a schematic block diagram of an exemplary embodiment of a semiconductor device.

Korean Patent Application No. 10-2010-0023407, filed on Mar. 16, 2010, in the Korean Intellectual Property Office, and entitled: "Semiconductor Device and Test Apparatus Including the Same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be further understood that, although the terms first, second, etc. may be used herein to describe various elements, regions and/or portions, these elements, parts, regions, layers and/or portions should not be limited by these terms. These terms are only used to distinguish one element from another. Thus, a first element, region or portion discussed below could be termed a second element, region or portion, without departing from the teachings of this disclosure.

FIG. 1 illustrates a schematic block diagram of an exemplary embodiment of a semiconductor device 100. Referring to FIG. 1, the semiconductor device 100 may include a command distributor 110, a command decoder 120, a signal generator 130, and a test pattern storage unit 140. The semiconductor device 100 may be realized on a single chip.

The command distributor 110 may receive a serial command that is synchronized with a first clock signal CLK1 from a test control unit 50. The command distributor 110 may convert the serial command into a parallel command. In more detail, the command distributor 110 may convert the serial command that is synchronized with the first clock signal CLK1 into a parallel command that is synchronized with a second clock signal CLK2. The first clock signal CLK1 is different from the second clock signal CLK2. A frequency of the first clock signal CLK1 may be less than a frequency of the second clock signal CLK2. Although not shown, the command distributor 110 may include a clock converter (not shown) that converts the first clock signal CLK1 into the second clock signal CLK2.

The command decoder 120 may receive the parallel command from the command distributor 110 and may generate a pattern sequence based on the parallel command. The pattern sequence may be logic data that is a base for generating operating signals to be applied to a device under test (DUT) 150. For example, the pattern sequence may be logic data that includes command information, address information, and data information about the operating signals to be applied to the DUT 150.

The test pattern storage unit 140 may store at least one piece of pattern information. More specifically, the test pattern storage unit 140 may receive a request signal from the command decoder 120 and may transmit the pattern information to the command decoder 120. The command decoder 120 may generate the pattern sequence by combining the parallel command and the pattern information with each other.

The signal generator 130 may receive the pattern sequence from the command decoder 120. The signal generator 130 may generate the operating signals that are synchronized with the second clock signal CLK2. The frequency of the second clock signal CLK2 may be identical with an operating frequency of the DUT 150. The operating signals may include a control signal, an address signal, and an input data signal. The operating signals generated by the signal generator 130 may be transmitted via a test signal channel 200. The operating signals transmitted via the test signal channel 200 may be applied to the DUT 150.

The DUT 150 may be a volatile memory device such as static random access memory (SRAM), dynamic RAM (DRAM) or synchronous DRAM (SDRAM), a nonvolatile memory device such as read-only memory (ROM), programmable ROM (PROM), erasable PROM (EPROM), electrically erasable PROM (EEPROM), flash memory, phase-change RAM (PRAM), magnetoresistive RAM (MRAM), resistive RAM (RRAM) or ferroelectric RAM (FRAM), or a memory component including the volatile memory device and the nonvolatile memory device. Also, the DUT 150 is not limited to a memory device or memory package. For example, the DUT 150 may be a memory module, a memory card, or a memory stick, which includes combined memory components. Furthermore, the DUT 150 may include chips such as an image signal processor (ISP), and a digital signal processor (DSP), which include or do not include the memory device.

Figure 2:
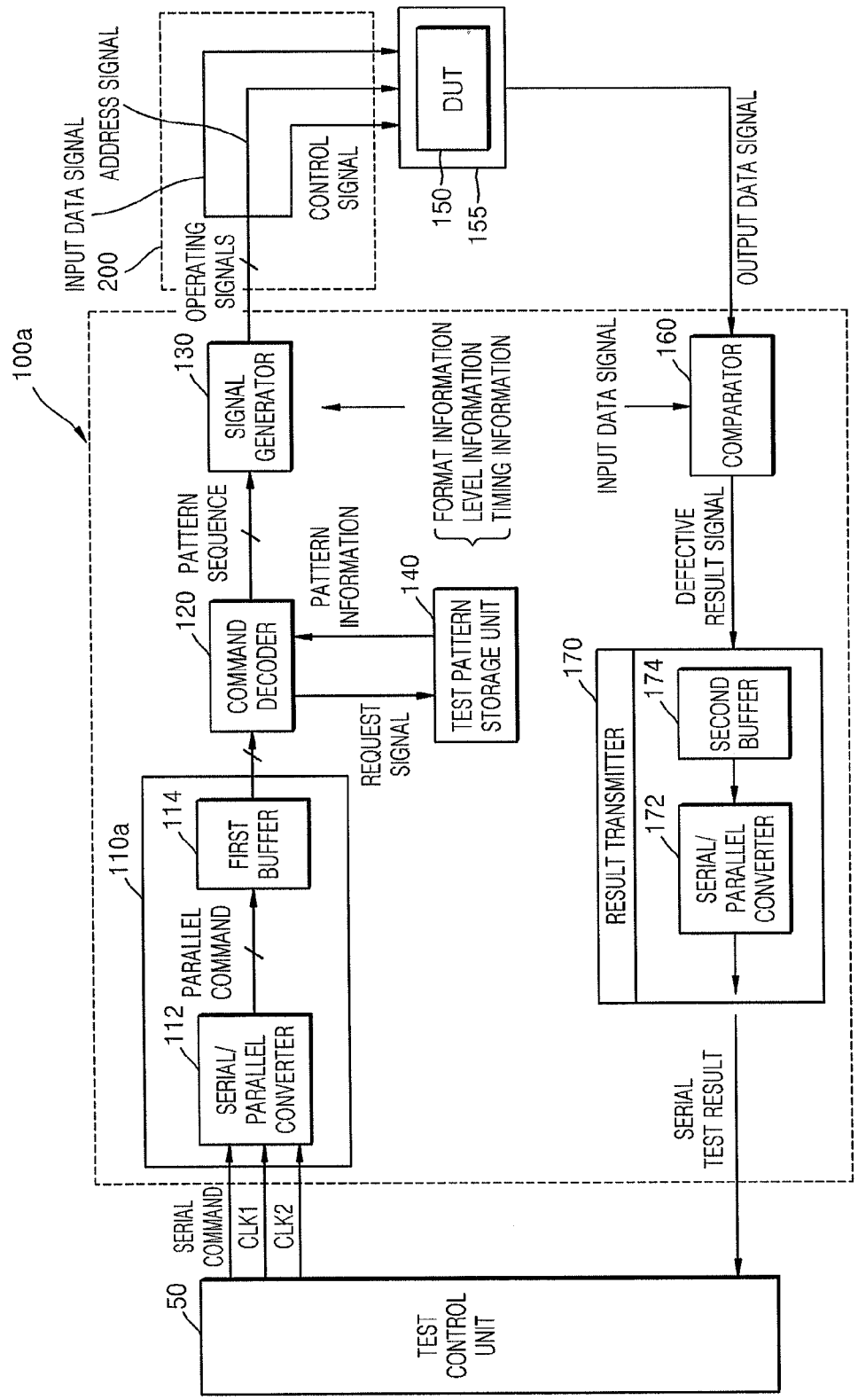
FIG. 2 illustrates a schematic block diagram of another exemplary embodiment of a semiconductor device.

FIG. 2 illustrates a schematic block diagram of another exemplary embodiment of a semiconductor device 100a. In general, only difference between the semiconductor device 100 of FIG. 1 and the semiconductor device 100a of FIG. 3 will be described below. That is, in general, features of the semiconductor devices 100, 100a described above will not be repeated below.

Referring to FIG. 2, the semiconductor device 100a may include a command distributor 110a, a comparator 160, the command decoder 120, the signal generator 130, the test pattern storage unit 140, and a result transmitter 170.

Referring to FIG. 2, the command distributor 110a may include a serial/parallel converter 112 and a first buffer 114. The serial/parallel converter 112 may convert a serial command received from a test apparatus into a parallel command. For example, the serial/parallel converter 112 may convert the serial command that is synchronized with the first clock signal CLK1 into a parallel command that is synchronized with the second clock signal CLK2. The first buffer 114 may store the parallel command converted while a command decoder 120 generates a pattern sequence.

The command decoder 120 may generate a request signal and a parameter signal based on the parallel command. For example, the command decoder 120 may divide the parallel command into the request signal and the parameter signal. The test pattern storage unit 140 may receive the request signal from the command decoder 120. The test pattern storage unit 140 may transmit pattern information corresponding to the request signal to the command decoder 120. The command decoder 120 may receive the pattern information. The command decoder 120 may generate the pattern sequence by increasing or decreasing the parameter signal according to the pattern information. This will be described in more detail with reference to FIG. 8.

The signal generator 130 may generate operating signals by combining the pattern sequence with format information, level information, and/or timing information about the DUT 150. For example, the signal generator 130 may generate the operating signals by combining logic data including command information, address information, and/or data information about the pattern sequence with the format information, the level information, and/or the timing information about the DUT 150. The operating signals may include a control signal, an address signal, and/or an input data signal. The format information, the level information, and the timing information about the DUT 150 may be stored in the test pattern storage unit 140.

The comparator 160 may receive an output data signal from the DUT 150 and may generate a defective result signal by comparing the output data signal with input data. In some embodiments, the comparator 160 may be included in the signal generator 130. In such embodiments, the comparator 160 may generate the defective result signal by comparing an input data signal generated by the signal generator 130 with the output data signal received from the DUT 150.

The result transmitter 170 may generate a serial test result in which the defective result signal generated by the comparator 160 is converted into a serial signal. The result transmitter 170 may transmit the serial test result to the test control unit 50. The result transmitter 170 may transmit the serial test result to the test control unit 50 by synchronizing the serial test result with the first clock signal CLK1. More specifically, the result transmitter 170 may convert the defective result signal that is synchronized with the second clock signal CLK2 having a relatively high frequency and may be a parallel signal, into the serial test result that is synchronized with the first clock signal CLK1 having a relatively low frequency and may be a serial signal. The result transmitter 170 may transmit the serial test result to the test control unit 50.

The result transmitter 170 may include a parallel/serial converter 172 and a second buffer 174. The parallel/serial converter 172 may convert the defective result signal that may be a parallel signal into a serial signal. The second buffer 174 may store the defective result signal that is generated by the comparator 160 while the result transmitter 170 may transmit the serial test result to the test control unit 50.

Figure 3:
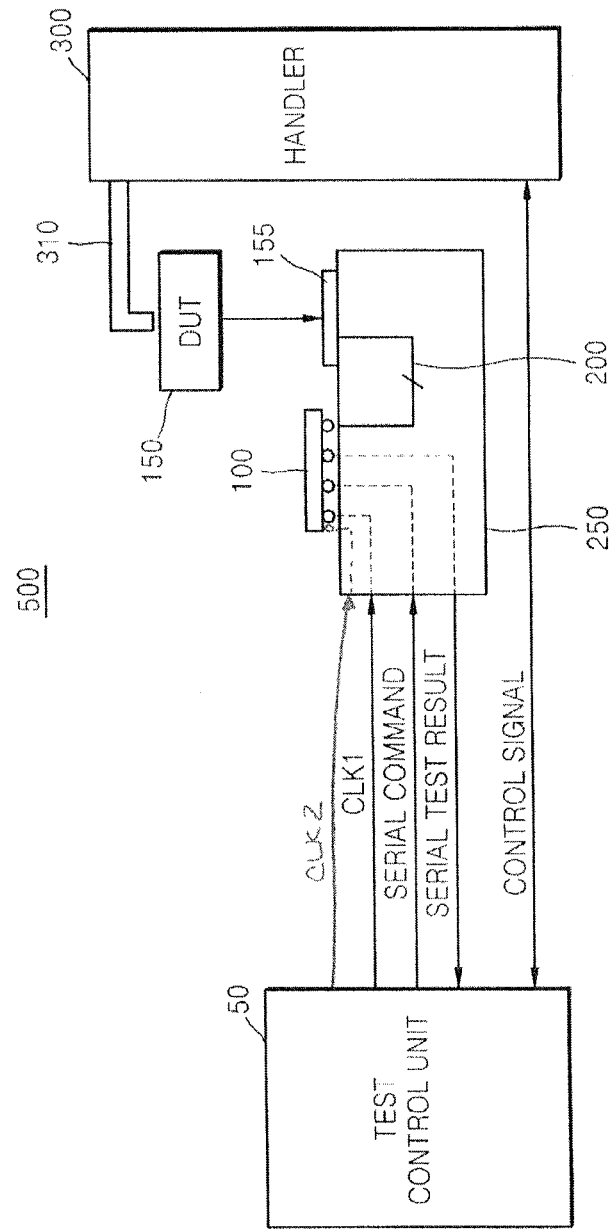
FIG. 3 illustrates a schematic block diagram of an exemplary embodiment of a test apparatus.

FIG. 3 illustrates a schematic block diagram of an exemplary embodiment of a test apparatus 500. The test apparatus 500 may include the semiconductor device 100 of FIG. 2. In general, only differences between the exemplary embodiment of FIG. 3 and the exemplary embodiments described above, and/or features not described above will be described below.

Referring to FIG. 3, the test apparatus 500 may include a substrate 250, a semiconductor device 100, a socket 155, a test signal channel 200, the test control unit 50, a handler 300, and/or a transportation unit 310. The substrate 250 may be a test interface unit. The substrate 250 may be a Hi-Fix board. The substrate 250 may receive the first clock signal CLK1 and a serial command as an input and may transmit a serial test result as an output. The first clock signal CLK1 and the serial command that are input to the substrate 250 may be transmitted to the semiconductor device 100, and the semiconductor device 100 may output the serial test result and may transmit the serial test result to the substrate 250.

The semiconductor device 100 and the socket 155 may be mounted on the substrate 250. The semiconductor device 100 may be implemented as a single chip and may be mounted on the substrate 250 in the form of a package in which the single chip is encapsulated, for example, in the form of a flip chip package. The socket 155 may provide space in which the DUT 150 is to be mounted. As described above, the semiconductor device 100 may include the command distributor 110, the command decoder 120, the signal generator 130, the test pattern storage unit 140, the comparator 160, and the result transmitter 170. In particular, as described above, the signal generator 130 included in the semiconductor device 100 may generate the operating signals that are synchronized with the second clock signal CLK2 that is different from the first clock signal CLK1, from the serial command that is synchronized with the first clock signal CLK1, and the signal generator 130 may apply the operating signals to the socket 155 connected to the DUT 150.

The test signal channel 200 may connect the semiconductor device 100 and the socket 155 and may transmit operating signals. More specifically, the test signal channel 200 may transmit the operating signals generated by the signal generator 130 of the semiconductor device 100 to the DUT 150 mounted on the socket 155.

While the exemplary embodiment of FIG. 3 illustrates the number of semiconductor devices 100, the number of test signal channels 200, and the number of sockets 155 as respectively one, embodiments are not limited thereto. For example, there may be a plurality of the semiconductor devices 100, a plurality of the test signal channels 200, a plurality of the sockets 155, etc. More particularly, the number of the semiconductor devices 100, the number of the test signal channels 200, and the number of sockets 155 may be respectively plural. In such embodiments, the plurality of the semiconductor devices 100 and the plurality of the sockets 155 may be connected to one another at a ratio of 1:1 via the plurality of the test signal channels 200.

The test control unit 50 may control a test process. The test control unit 50 may receive a serial test result from the substrate 250. Also, the test control unit 50 may generate a control signal for controlling the handler 300 based on the serial test result and may apply the control signal to the handler 300. The handler 300 may mount the DUT 150 on the socket 155 via the transportation unit 310. The transportation unit 310 may be a robot arm. Also, the handler 300 may sort the DUT 160 by determining whether the DUT 150 is defective or not, according to the control signal received from the test control unit 50.

Figure 4:
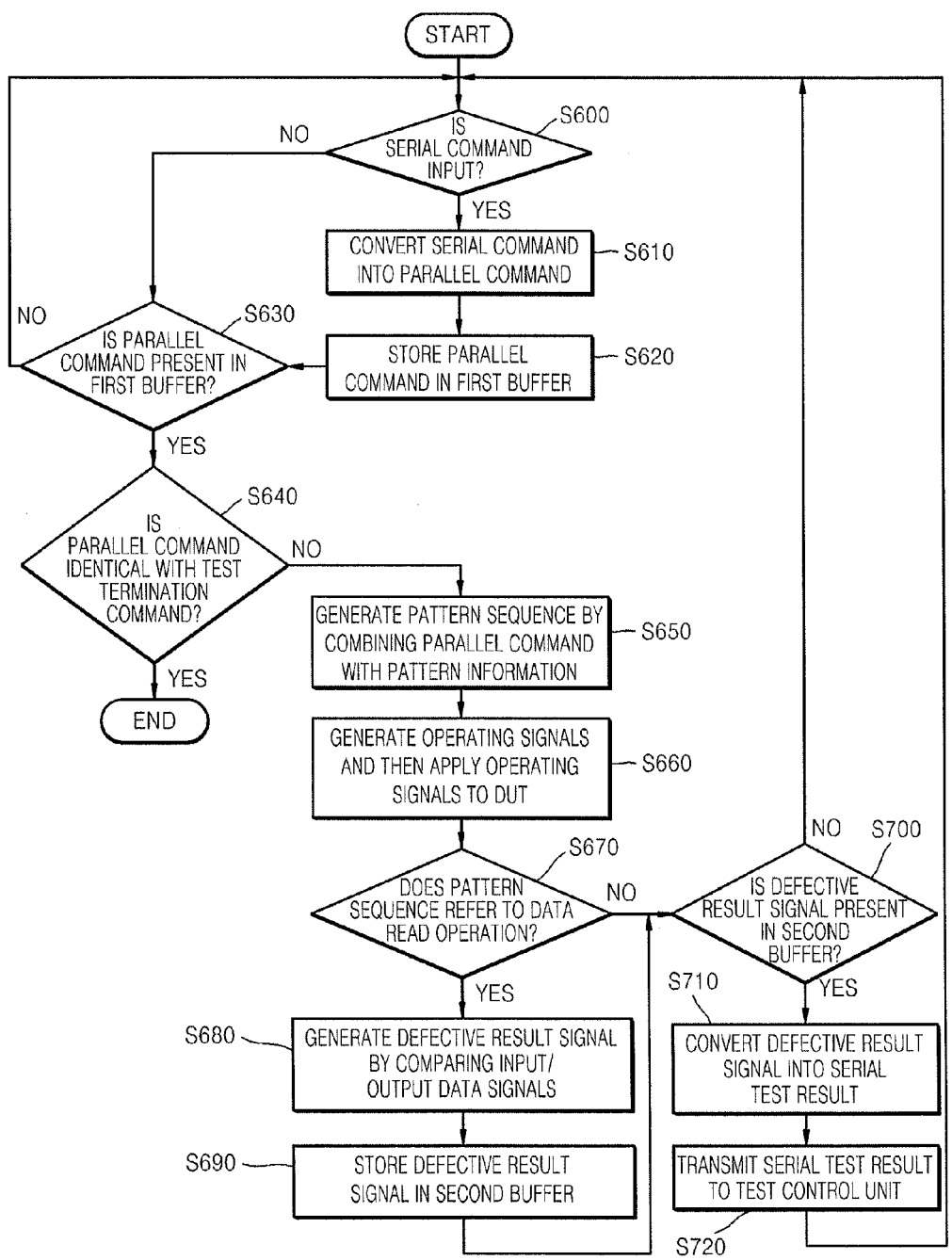
FIG. 4 illustrates a flowchart of an exemplary embodiment of a test method.

FIG. 4 illustrates a flowchart of an exemplary embodiment of a test method, which illustrates an exemplary method of operating the semiconductor device 100a of FIG. 2, which is included in the test apparatus.

Referring to FIGS. 2 and 4, during S600, it may be determined whether a serial command is input to the command distributor 110a of the semiconductor device 100a. When the serial command is input to the command distributor 110a, during S610, the serial/parallel converter 112 of the command distributor 110a may convert the serial command into a parallel command. During S620, the converted parallel command may be stored in the first buffer 114.

During S600, when it is determined that the serial command is not input to the command distributor 110a, during S630, it may be determined whether the parallel command is present in the first buffer 114. When it is determined that the parallel command is present in the first buffer 114, during S640, the command decoder 120 of the semiconductor device 100a may receive the parallel command stored in the first buffer 114 and may determine whether the parallel command is a test termination command or not. When the parallel command is the test termination command, a test may be terminated.

When the parallel command is not the test termination command, during S650, the command decoder 120 may generate a pattern sequence by combining the parallel command with the pattern information received from the test pattern storage unit 140. During S660, the signal generator 130 may receive the pattern sequence, may generate operating signals of the DUT 150 based on the pattern sequence, and may apply the operating signals to the DUT 150. During S670, it may be determined whether a next pattern sequence refers to a data read operation or not. For example, when it is checked that the pattern sequence refers to a data write operation, the signal generator 130 may apply a control signal, an address signal, and an input data signal for storing data in the DUT 150 and thus, data may be stored in the DUT 150.

Also, for example, when the pattern sequence refers to a data read operation, the signal generator 130 may apply a control signal, an address signal, and an input data signal for reading data to the DUT 150 and thus, an output data signal may be output by the DUT 150. During S680, the comparator 160 may compare the output data signal with the input data signal and may generate a defective result signal. During S690, the result transmitter 170 may receive the defective result signal, and the second buffer 174 may store the defective result signal.

During S670, when it is determined that the next pattern sequence does not refer to a data read operation or after the defective result signal is stored in the second buffer, during S700, it may be determined whether the defective result signal is present in the second buffer 174. When it is determined that the defective result signal is present in the second buffer 174, during S710, the parallel/serial converter 172 may convert the defective result signal into a serial test result that is a serial signal. During S720, the result transmitter 170 may transmit the serial test result that is synchronized with the first clock signal CLK1 to the test control unit 50.

Figure 6:
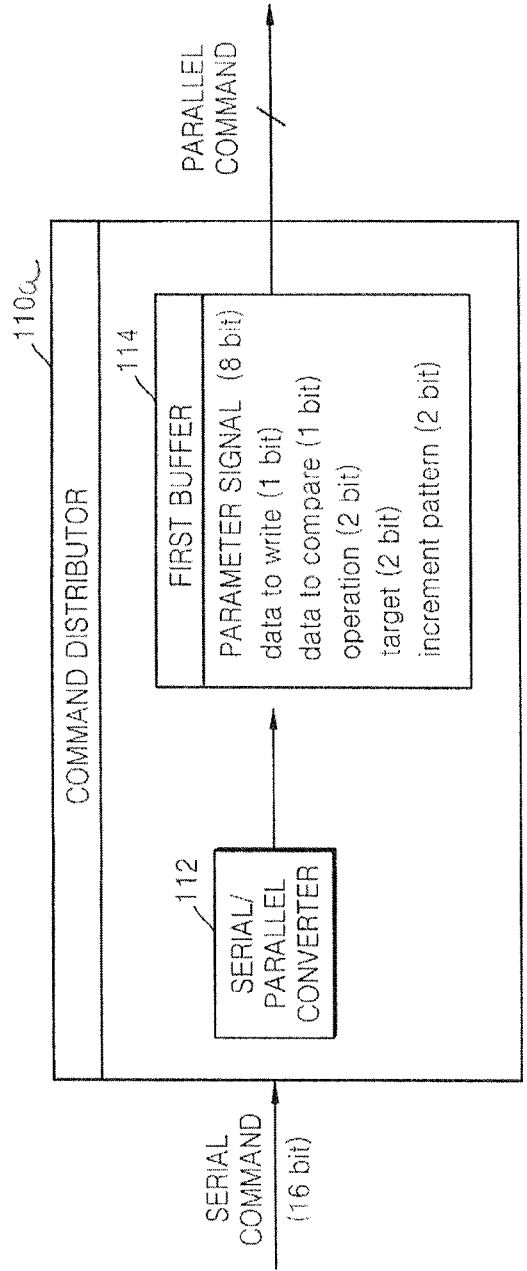
FIG. 6 illustrates a detailed block diagram of an exemplary embodiment of a command distributor employable in the semiconductor device of FIG. 2.
Figure 7:
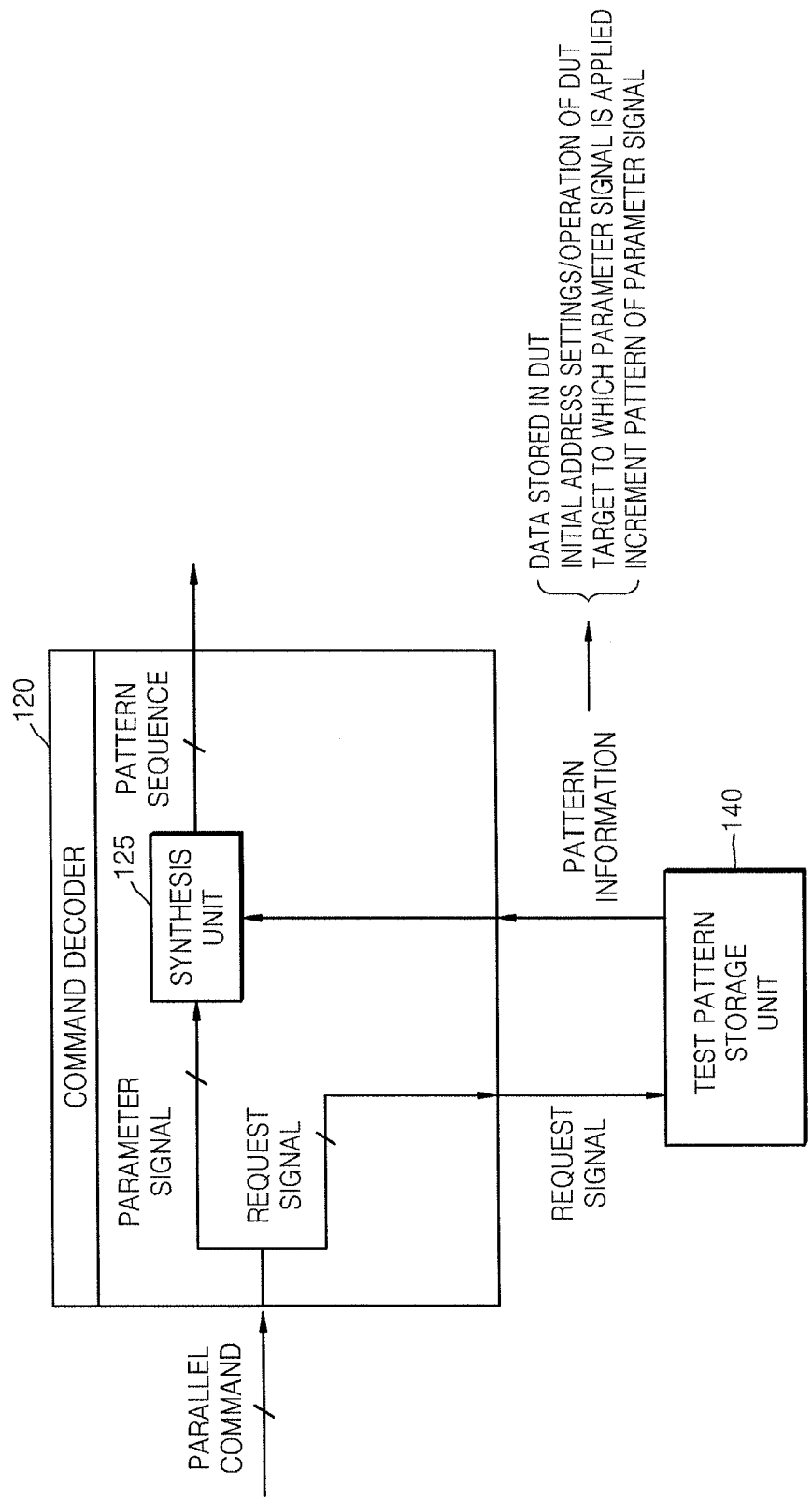
FIG. 7 illustrates a detailed block diagram of a command decoder of the semiconductor device of FIG. 2.

FIGS. 5A, 5B, 5C, and 5D illustrate tables for explaining exemplary serial/parallel commands employable by the semiconductor device 100, 100a. FIG. 6 illustrates a detailed block diagram of an exemplary embodiment of the command distributor 110a employable in the semiconductor device 100a of FIG. 2. FIG. 7 illustrates a detailed block diagram of an exemplary embodiment of the command decoder 120 of the semiconductor device 100a of FIG. 2.

Referring to FIGS. 2, 5A, 6, and 7, the serial command may be synchronized with the first clock signal CLK1 and may be input to the command distributor 110a of the semiconductor device 100a. In the following exemplary description, it is assumed that the serial command is, e.g., a 16-bit data stream.

However, embodiments are not limited thereto, i.e., the serial command may include a 16-bit data stream or a data stream of higher or lower bits. Assuming the exemplary 16-bit data stream, as illustrated in FIGS. 5A and 6, a first 8 bits of the data stream, i.e., 8 bits from a most significant bit (MSB) may be a parameter signal, and the other 8 bits, i.e., 8 bits from a least significant bit (LSB) may be a request signal. The parameter signal may include information about an address applied to the DUT 150. The request signal may include information for generating data applied to the DUT 150 and information for increasing or decreasing an address.

The serial command including the parameter signal and the request signal may be converted by the serial/parallel converter 112 into the parallel command. The parallel command may be stored in the first buffer 114. The command decoder 120 may receive the parallel command and may transmit the request signal in the parallel command to the test pattern storage unit 140. The test pattern storage unit 140 may receive the request signal and may transmit pattern information corresponding to the request signal to the command decoder 120. Referring to FIG. 7, the command decoder 120 may include a synthesis unit 125. The synthesis unit 125 may receive the pattern information and may generate a pattern sequence by increasing or decreasing the parameter signal according to the pattern information.

More specifically, referring to FIGS. 5A and 5B, a first bit of the request signal may correspond to data stored in the DUT 150 when a write command is generated. A second bit of the request signal may correspond to data to be compared with data output by the DUT 150 according to a read command. When the first or second bit of the request signal is 0, data corresponding to the first or second bit of the request signal is 00h. Thus, the test pattern storage unit 140 may transmit pattern information including data "00h" to the command decoder 120. When the first or second bit of the request signal is 1, data corresponding to the first or second bit of the request signal is FFh. Thus, the test pattern storage unit 140 may transmit pattern information including data "FFh" to the command decoder 120.

In the exemplary embodiment of FIGS. 5A and 5B, only one bit is allocated to write/read commands. Thus, only two types of data such as "00h" or "FFh" are stored or loaded. However, embodiments are not limited thereto. Two or more bits may be allocated to the write/read commands, and thus, more types of data may be stored or loaded.

Referring to FIGS. 5A and 5C, a third bit and a fourth bit of the request signal may refer to initial address settings and an operation of the DUT 150. When both the third and fourth bits of the request signal are 0, the test pattern storage unit 140 may generate pattern information for setting an initial address. When the third bit of the request signal is 0 and the fourth bit thereof is 1, the test pattern storage unit 140 may generate pattern information for allowing the DUT 150 to perform a data read operation. When the third bit of the request signal is 1 and the fourth bit thereof is 0, the test pattern storage unit 140 may generate pattern information for allowing the DUT 150 to perform a data write operation. When both the third and fourth bits of the request signal are 1, the test pattern storage unit 140 may generate pattern information for allowing the DUT 150 to perform the data read operation and then the data write operation.

Referring to FIGS. 5A and 5D, a fifth bit and a sixth bit of the request signal may refer to a target to which the parameter signal is applied. When both the fifth bit and the sixth bit of the request signal are 0, the test pattern storage unit 140 may generate pattern information for allowing the parameter signal to be applied to a column address of the DUT 150. When the fifth bit of the request signal is 0 and the sixth bit thereof is 1, the test pattern storage unit 140 may generate pattern information for allowing the parameter signal to be applied to a row address of the DUT 150. When the fifth bit of the request signal is 1 and the sixth bit thereof is 0, the test pattern storage unit 140 may generate pattern information for allowing the parameter signal to be applied to a bank address of the DUT 150.

Referring to FIGS. 5A and 5E, a seventh bit and an eighth bit of the request signal may refer to an increment pattern of the parameter signal. When both the seventh bit and the eighth bit of the request signal are 0, the test pattern storage unit 140 may generate pattern information for increasing the parameter signal from the LSB. When the seventh bit of the request signal is 0 and the eighth bit of the request signal is 1, the test pattern storage unit 140 may generate pattern information for increasing the parameter signal from the MSB. When the seventh bit of the request signal is 1 and the eighth bit thereof is 0, the test pattern storage unit 140 may generate pattern information for decreasing the parameter signal from the LSB. When the seventh bit of the request signal is 0 and the eighth bit thereof is 1, the test pattern storage unit 140 may generate pattern information for decreasing the parameter signal from the MSB.

In some embodiments, the test pattern storage unit 140 may generate pattern information corresponding to the request signal, and the pattern information may include, e.g., i) first pattern information about data stored in the DUT 150, ii) second pattern information about initial address settings and an operation of the DUT 150, iii) third pattern information about a target to which the parameter signal is applied, and iv) fourth pattern information about an increment pattern of the parameter signal.

The synthesis unit 125 may generate a pattern sequence by combining the parameter signal with the first through fourth pattern information. Thus, the pattern sequence is logic data about the command information, the address information, and the data information about the operating signals applied to the DUT 150.

FIG. 8 illustrates a timing table for explaining exemplary operations of the semiconductor device 100, 100a of FIG. 1 or 2 and the test apparatus 500 of FIG. 3.

Referring to FIG. 2 and FIGS. 5A through 8, a parallel command "0000 0000 00 00 00 00" may be input at a first rising/falling edge of the second clock signal CLK2. In this case, since both the third and fourth bits of the request signal are 0, the test pattern storage unit 140 may generate the second pattern information about initial address settings. Also, since both the fifth and sixth bits of the request signal are 0, the test pattern storage unit 140 may generate the third pattern information for indicating that the target to which the parameter signal is applied is a column address. The synthesis unit 125 may set an initial column address as "0000 0000" by combining the second and third pattern information with the parameter signal "0000 0000".

A parallel command "0000 0000 00 00 01 00" may be input at a second rising/falling edge of the second clock signal CLK2. In this case, since both the third and fourth bits of the request signal are 0, the test pattern storage unit 140 may generate the second pattern information about initial address settings. Also, since the fifth bit of the request signal is 0 and the sixth bit thereof is 1, the test pattern storage unit 140 may generate the third pattern information for indicating that the target to which the parameter signal is applied is a row address. The synthesis unit 125 may set an initial row address as "0000 0000" by combining the second and third pattern information with the parameter signal "0000 0000".

A parallel command "0000 0000 00 00 10 00" is input at a third rising/falling edge of the second clock signal CLK2. In this case, since both the third and fourth bits of the request signal are 0, the test pattern storage unit 140 may generate the second pattern information about initial address settings. Also, since the fifth bit of the request signal is 1 and the sixth bit thereof is 0, the test pattern storage unit 140 may generate the third pattern information for indicating that the target to which the parameter signal is applied is a bank address. The synthesis unit 125 may set an initial bank address as "00" by combining the second and third pattern information with the parameter signal "0000 0000".

A parallel command "0011 1111 01 01 00 00" may be input at a fourth rising/falling edge of the second clock signal CLK2. In this case, since the third bit of the request signal is 0 and the fourth bit thereof is 1, the test pattern storage unit 140 may generate the second pattern information about a data read operation of the DUT 150. Also, since the fifth bit of the request signal is 0 and the sixth bit thereof is 0, the test pattern storage unit 140 may generate the third pattern information for indicating that the target to which the parameter signal is applied is a column address. Furthermore, since the seventh bit of the request signal is 0 and the eighth bit thereof is 0, the test pattern storage unit 140 may generate the fourth pattern information for increasing the parameter signal from the LSB. Since the second bit of the request signal is 1, the test pattern storage unit 140 may generate the first pattern information for indicating that data to be compared with data to be read by the DUT 150 is "FFh" in response to a read command.

The synthesis unit 125 may generate a pattern sequence for allowing the DUT 150 to perform a data read operation (second pattern information) while sequentially increasing the parameter signal from the initial column address "0000 0000" to the column address (third pattern information) "0011 1111" (parameter signal) from the LSB (fourth pattern information), by combining the second and third pattern information with the parameter signal "0011 1111". Also, the synthesis unit 125 may generate a pattern sequence for allowing the signal generator 130 to generate an input data signal "FFh" (first pattern information). The input data signal "FFh" may be input to the comparator 160.

A pattern sequence for allowing the DUT 150 to perform a data read operation on the column address "0000 0000" at a fourth rising/falling edge of the second clock CLK2 may be input to the signal generator 130. Thus, the signal generator 130 generates operating signals for allowing the DUT 150 to read data such as a bank address "00", a row address "0000 0000", and a column address "0000 0000". After that, the comparator 160 may generate a defective result signal by comparing the output data signal output by the DUT 150 with the input data signal "FFh".

A pattern sequence for allowing the DUT 150 to perform a data read operation on the column address "0000 0001" that increases from the LSB at a fifth rising/falling edge of the second clock CLK2 may be input to the signal generator 130. Thus, the signal generator 130 may generate operating signals for allowing the DUT 150 to read data such as a bank address "00", a row address "0000 0000", and a column address "0000 0001". After that, the comparator 160 may generate a defective result signal by comparing the output data signal output by the DUT 150 with the input data signal "FFh".

The above-described operations are repeatedly performed so that operating signals for allowing the DUT 150 to perform the data read operation while sequentially increasing the parameter signal from the column address "0000 0000" to the column address "0011 1111" at the rising/falling edges between the fourth rising/falling edge and the 130th rising/falling edge of the second clock signal CLK2 may be generated.

As described above, in one or more embodiments of a semiconductor device and a test apparatus including one or more features of embodiments described above, high-frequency operating units used for a test may be realized by the semiconductor device, and manufacturing costs of the test apparatus may be reduced.

In one or more embodiments, even when a DUT with a new specification is tested, the test apparatus may perform a test process by replacing a semiconductor device that needs to be operated at high speed so that replacement costs can be reduced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a test pattern storage unit storing at least one pattern information;
   a command distributor configured to receive a serial command that is synchronized with a first clock signal and convert the serial command into a parallel command;
   a command decoder configured to receive the parallel command and generate a pattern sequence based on the parallel command, the command decoder configured to generate the pattern sequence by combining the parallel command and the at least one pattern information stored in the test pattern storage unit; and
   a signal generator configured to receive the pattern sequence and generate operating signals synchronized with a second clock signal, wherein the signal generator outputs the operating signals in parallel synchronized with the second clock signal and wherein a frequency of the first clock signal is less than a frequency of the second clock signal, and
   wherein the parallel command includes a request signal and a parameter signal, and the test pattern storage unit receives the request signal and transmits the pattern information corresponding to the request signal to the command decoder, and the command decoder includes a synthesis unit generating the pattern sequence by increasing or decreasing the parameter signal according to the pattern information, the parameter signal indicative of an address of a device under test to be tested.

2. The semiconductor device as claimed in claim 1, wherein the command distributor is configured to convert the serial command into the parallel command synchronized with the second clock signal.

3. The semiconductor device as claimed in claim 1, wherein the signal generator is configured to generate the operating signals by combining the pattern sequence with format information, level information, and timing information about a device under test (DUT).

4. The semiconductor device as claimed in claim 3, wherein the operating signals include a control signal, an address signal, and an input data signal.

5. The semiconductor device as claimed in claim 1, wherein the command distributor further comprises a serial/parallel converter and a first buffer, and the serial/parallel converter is configured to convert the serial command into the parallel command, and the first buffer is configured to store a new parallel command while the command decoder generates the pattern sequence.

6. The semiconductor device as claimed in claim 1, further comprising
   a comparator configured to receive an output data signal from a DUT and generate a defective result signal by comparing the output data signal with an input data signal, the input signal being one of the operating signals.

7. The semiconductor device as claimed in claim 6, further comprising
   a result transmitter configured to transmit a serial test result in which the defective result signal is synchronized with the first clock signal.

8. The semiconductor device as claimed in claim 7, wherein the result transmitter comprises a parallel/serial converter adapted to convert the defective result signal into a serial signal.

9. The semiconductor device as claimed in claim 8, wherein the result transmitter comprises a second buffer, and the second buffer is configured to store a new defective result signal while the result transmitter transmits the serial test result.

10. The semiconductor device as claimed in claim 1, wherein the request signal includes information to select the pattern sequence from a plurality of store pattern sequences and the parameter signal includes information indicative of an area of a device under test to be tested.

11. A test apparatus, comprising:
    at least one semiconductor device,
    a substrate on which the semiconductor device is mounted; and
    at least one socket mounted on the substrate and providing space in which a device under test (DUT) is to be mounted,
    wherein the at least one semiconductor device includes:
    a command distributor configured to receive a serial command that is synchronized with a first clock signal and convert the serial command into a parallel command;
    a command decoder configured to receive the parallel command and generate a pattern sequence based on the parallel command; and
    a signal generator configured to receive the pattern sequence and generate operating signals synchronized with a second clock signal, wherein the signal generator outputs the operating signals in parallel synchronized with the second clock signal, wherein a frequency of the first clock signal is less than a frequency of the second clock signal,
    wherein the substrate includes a test signal channel connecting the semiconductor device with the socket, and wherein the test signal channel transmits the operating signals from the signal generator to the DUT connected to the socket.

12. The test apparatus as claimed in claim 11, wherein the semiconductor device includes a plurality of semiconductor devices, and the socket includes a plurality of sockets, and the test signal channel includes a plurality of test signal channels, and the plurality of semiconductor devices and the plurality of sockets are connected at a ratio of 1:1 via the plurality of test signal channels.

13. The test apparatus as claimed in claim 11, wherein the substrate includes a Hi-Fix board.

14. A test apparatus, comprising:
    a substrate configured to receive a serial command that is synchronized with a first clock signal;

at least one socket mounted on the substrate and providing space in which a device under test (DUT) is to be mounted; and at least one semiconductor device mounted on the substrate and connected between the substrate and the at least one socket, wherein the at least one semiconductor device includes:

a command decoder configured to receive the parallel command and generate a pattern sequence based on the parallel command, the command decoder configured to generate the pattern sequence by combining the parallel command and the at least one pattern information stored in a test pattern storage unit, and a signal generator configured to generate operating signals synchronized with a second clock signal that is different from the first clock signal from the serial command and apply the operating signals to the DUT, wherein:

the parallel command includes a request signal and a parameter signal, and the test pattern storage unit receives the request signal and transmits the pattern information corresponding to the request signal to the command decoder, and the command decoder includes a synthesis unit generating the pattern sequence by increasing or decreasing the parameter signal according to the pattern information, the parameter signal indicative of an address of a device under test to be tested, and the signal generator outputs the operating signals in parallel synchronized with the second clock signal.

15. The test apparatus as claimed in claim 14, wherein a frequency of the first clock signal is less than a frequency of the second clock signal.

16. The test apparatus as claimed in claim 14, further comprising a test signal channel connecting the semiconductor device and the socket, wherein the test signal channel transmits the operating signals from the signal generator to the DUT connected to the socket.

17. The test apparatus as claimed in claim 16, wherein the semiconductor device includes a plurality of semiconductor devices, and the socket includes a plurality of sockets, and the test signal channel includes a plurality of test signal channels, and the plurality of semiconductor devices and the plurality of sockets are connected at a ratio of 1:1 via the plurality of test signal channels.

* * * * *